(12) United States Patent
Hsu et al.

(10) Patent No.: US 12,237,039 B2
(45) Date of Patent: *Feb. 25, 2025

(54) DEVICE ID SETTING METHOD AND ELECTRONIC DEVICE APPLYING THE DEVICE ID SETTING METHOD

(71) Applicant: PixArt Imaging Inc., Hsin-Chu (TW)

(72) Inventors: En-Feng Hsu, Hsin-Chu (TW); Shiaw-Yu Jou, Hsin-Chu (TW); Tien-Chung Yang, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/412,632

(22) Filed: Jan. 15, 2024

(65) Prior Publication Data

US 2024/0153543 A1 May 9, 2024

Related U.S. Application Data

(63) Continuation of application No. 17/458,574, filed on Aug. 27, 2021, now Pat. No. 11,915,780.

(51) Int. Cl.
*G06F 13/00* (2006.01)
*G06F 13/42* (2006.01)
*G11C 7/10* (2006.01)

(52) U.S. Cl.
CPC ........ *G11C 7/1012* (2013.01); *G06F 13/4221* (2013.01)

(58) Field of Classification Search
CPC ............... G11C 7/1012; G06F 13/4221; G06F 2213/0052; G06F 13/4291
See application file for complete search history.

(56) References Cited

U.S. PATENT DOCUMENTS

| | | | |
|---|---|---|---|
| 7,062,736 B2 * | 6/2006 | Oleksinski | G06F 30/30 716/108 |
| 2013/0290577 A1 * | 10/2013 | Fugate | G06F 13/4081 710/105 |
| 2016/0170930 A1 * | 6/2016 | Weng | G06F 1/26 710/110 |
| 2016/0299572 A1 | 10/2016 | Grover | |
| 2016/0306678 A1 * | 10/2016 | Hira | G06F 9/5083 |
| 2016/0335219 A1 * | 11/2016 | Chang | G06F 11/221 |
| 2019/0196961 A1 | 6/2019 | Li | |
| 2020/0311011 A1 * | 10/2020 | Kim | G06F 1/3287 |
| 2021/0134336 A1 | 5/2021 | Na | |
| 2021/0271627 A1 | 9/2021 | Vaarlid | |
| 2022/0309023 A1 * | 9/2022 | Vernekar | G06F 13/4291 |

* cited by examiner

*Primary Examiner* — Henry Tsai
*Assistant Examiner* — Kim T Huynh
(74) *Attorney, Agent, or Firm* — Winston Hsu

(57) ABSTRACT

An electronic device comprising: a clock pin; at least one data pin; a storage device, configured to store at least one program; a processing circuit, coupled to the data pin. A device ID setting method is performed when the processing circuit executes the program stored in the storage device. The device ID setting method comprises; (a) recording connections between pins of a first electronic device and pins of the electronic device by the electronic device, wherein the first electronic device comprises at least one data pin; and (b) applying the connections between the pins of the first electronic device and the pins of the electronic device as a device ID of the first electronic device by the electronic device.

16 Claims, 4 Drawing Sheets

DEVICE ID SETTING METHOD AND ELECTRONIC DEVICE APPLYING THE DEVICE ID SETTING METHOD

CROSS REFERENCE TO RELATED APPLICATIONS

This application is a continuation application of U.S. application Ser. No. 17/458,574, filed on Aug. 27, 2021. The content of the application is incorporated herein by reference.

BACKGROUND OF THE INVENTION

1. Field of the Invention

The present invention relates to a device id setting method and an electronic device applying the device id setting method, and particularly relates to a device id setting method which can easily sets the device ID and an electronic device applying the device id setting method.

2. Description of the Prior Art

Conventionally, a host device (e.g., an IC of a computer) needs device IDs of slave devices (e.g., ICs of peripheral device coupled to the computer) to identify slave devices, such that the host device can transmit data to a correct slave device.

However, in the prior art, the device ID is hard to change. For example, the device ID must be set by changing the IO voltage of the IC in the peripheral device. Alternatively, the device ID must be written into an EPROM of the peripheral device.

Therefore, a device ID setting method which can allow the user to easily set the device ID is needed.

SUMMARY OF THE INVENTION

One objective of the present invention is to provide an electronic device which can simplify the steps of setting device IDs.

Another objective of the present invention is to provide a device ID setting method which can simplify the steps of setting device IDs.

One embodiment of the present invention discloses an electronic device, comprising: a clock pin; at least one data pin; a storage device, configured to store at least one program; a processing circuit, coupled to the data pin. A device ID setting method is performed when the processing circuit executes the program stored in the storage device. The device ID setting method comprises; (a) recording connections between pins of a first electronic device and pins of the electronic device by the electronic device, wherein the first electronic device comprises at least one data pin; and (b) applying the connections between the pins of the first electronic device and the pins of the electronic device as a device ID of the first electronic device by the electronic device.

Another embodiment of the present invention discloses a device ID setting method applied to a first electronic device having at least two data pins. The method comprises: (a) recording connections between pins between the first electronic device and pins of a second electronic device by the second electronic device, wherein the second electronic device comprises a clock pin and at least one data pin; and (b) applying the connections between the pins of the first electronic device and the pins of the second electronic device as a device ID of the first electronic device by the second electronic device.

In view of above-mentioned embodiments, the device ID can be set via recording the connection between pins, thus the steps of setting device ID in prior art can be simplified.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided to explain the concept of the present invention. Please note, each component in the embodiments can be implemented by hardware (e.g. device or circuit) or firmware (e.g. processor installed with at least one program). Further, the term "first", "second" . . . are only for defining different steps or components, but do not mean any sequence thereof. Also, in following embodiments, the first electronic device and the second electronic device can be circuits or chips, or electronic devices (such as a computer or an optical mouse) comprising pins illustrated below. Further, in following embodiments, the first electronic device can be a slave device and the second electronic device can be a master device, but not limited.

Figure 1:
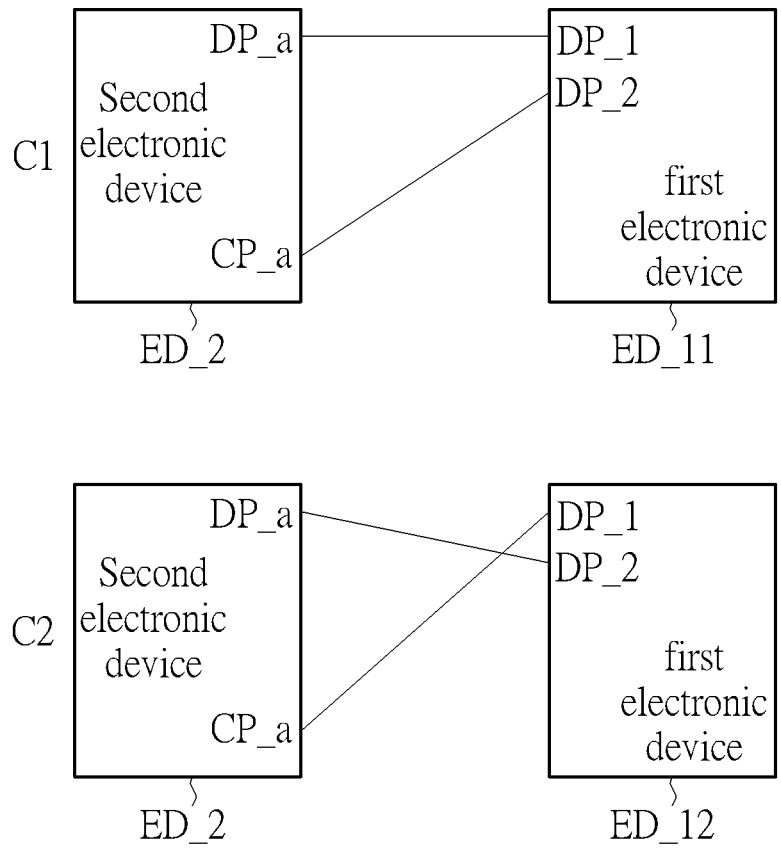
FIG. 1 is a schematic diagram illustrating a device ID setting method according to one embodiment of the present invention.

FIG. 1 is a schematic diagram illustrating a device ID setting method according to one embodiment of the present invention. Please note, in the embodiment of FIG. 1, the first electronic devices ED_11 and ED_12 are coupled to the same second electronic device ED_2, but the second electronic device ED_2 are illustrated as two second electronic device ED_2, for clearly illustrating the connections C1, C2. As illustrated in FIG. 1, the first electronic devices ED_11, ED_12 respectively comprises data pins DP_1 and DP_2. The data pin DP_1 can be named as a first data pin, and the data pin DP_2 can be named as a second data pin. Also, the second electronic device ED_2 comprises a data pin DP_a and a clock pin CP_a. In one embodiment, communication between the first electronic device ED_11, ED_12 and the second electronic device ED_2 follows an I2C (I square C) standard. In such case, the data pin DP_1 is configured to provide one way transmission from the first electronic device ED_11, ED_12 to the second electronic device ED_2, such as a GPIO (General Purpose input/output) pin. Also, the data pin DP_2 is configured to provide one way transmission from the second electronic device ED_2 to the first electronic device ED_11, ED_12, such as an SDA pin. Also, the data pin DP_a is an SDA (Serial Data Line) pin, and the clock pin CP_a is an SCL (Serial clock Line) pin.

The second electronic device ED_2 identifies the first electronic device ED_11, ED_12 according to the connections respectively between the pins of the first electronic device ED_11, ED_12 and the second electronic device ED_21. Specifically, the second electronic device ED_2 firstly records the connection C1 for the first electronic device ED_11 and records the connection C2 for the first electronic device ED_12. In other words, the second electronic device ED_2 uses the connections C1, C2 as device IDs for the first electronic device ED_11, ED_12.

In the embodiment of FIG. 1, the connection C1 means the data pin DP_a is coupled to the data pin DP_1 of the first electronic device ED_11 and the clock pin CP_a is coupled to the data pin DP_2 of the first electronic device ED_11. Also, the connection C2 means the data pin DP_a is coupled to the data pin DP_2 of the first electronic device ED_12 and the clock pin CP_a is coupled to the data pin DP_1 of the first electronic device ED_12.

After recording the connections C1, C2, the second electronic device ED_2 can set pins of the first electronic devices ED_11, ED_12 such that communication between the second electronic device ED_2 and the first electronic devices ED_11, ED_12 can normally operate. For example, the data pin DP_2 of the first electronic device ED_11 can be set to a clock pin. Also, the data pin DP_1 of the first electronic device ED_12 can be set to a clock pin. The first electronic devices ED_11, ED_12 can have logic gates or at least one multiplexer for the changing of the pins.

After set the connections of first electronic device ED_11, ED_12, the second electronic device ED_2 can transmit data to a correct electronic device or receive data from a correct electronic device based on the recorded connections. For example, if the second electronic device ED_2 needs to transmit data to the first electronic device ED_11 or receives data from the first electronic device ED_11, it can search an electronic device which is recorded as having the connection C1 and transmits data to it or receives data from it. Please note, in such step, although the first electronic device ED_11 is recorded as having the connection C1, it's real connection is already changed to a connection which can normally communicate with the second electronic device ED_2.

Many methods can be applied to detect the above-mentioned connections. In one embodiment, the connections are detected according to a transition sequence of signals which the second electronic device ED_2 transmits to the first electronic device ED_11 or ED_12, by the second electronic device ED_2.

Figure 2:
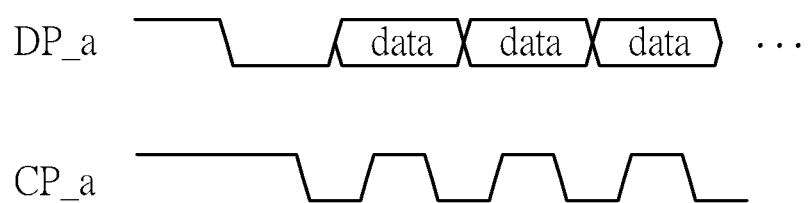
FIG. 2 is a wave chart illustrating signals in the embodiment of FIG. 1, according to one embodiment of the present invention.

In one embodiment, after the second electronic device ED_2 sends a start command to the first electronic device ED_11 or ED_12, a data signal from the data pin DP_a transits before a clock signal from the clock pin CP_a transits. The transition can mean, for example, pulling down or pulling up. FIG. 2 is a wave chart illustrating signals in the embodiment of FIG. 1, according to one embodiment of the present invention. As illustrated in FIG. 2, after the second electronic device ED_2 sends a start command (not illustrated) to the first electronic device ED_11 or ED_12, the data signal from the data pin DP_a is pulled down (transit). After that, the clock signal from the clock pin CP_a is pulled down. Then, the second electronic device ED_2 starts to transmit data to the first electronic device ED 1.

In one embodiment, the first electronic device ED_11 sends responses to the second electronic device ED_2 while signals from the second electronic device ED_2 transit. Therefore, the second electronic device ED_2 can acquire the transition sequence of signals which the second electronic device ED_2 transmits to the first electronic device ED_11 or ED_12 according to the responses. However, the second electronic device ED_2 can acquire the transition sequence by other methods.

Therefore, the second electronic device ED_2 can determine which pin does a pin of the first electronic device ED_11 is coupled according to the transition sequence. For example, if the second electronic device ED_2 detects that the signal transmitted to the data pin DP_1 of the first electronic device EP_1 firstly transits, it means the data pin DP_1 of the first electronic device EP_1 is coupled to the data pin DP_a thereof. Also, if the second electronic device ED_2 detects that the signal transmitted to the data pin DP_2 of the first electronic device EP_1 transits after the signal transmitted to the data pin DP_1, it means the data pin DP_2 of the first electronic device EP_1 is coupled to the clock pin CP_a thereof.

Figure 3:
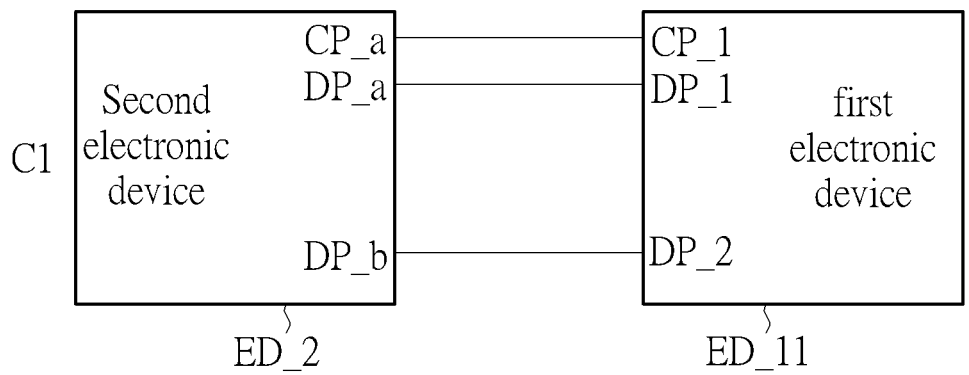
FIG. 3, FIG. 4, FIG. 5 are schematic diagrams illustrating a device ID setting method according to one embodiment of the present invention.
Figure 3:
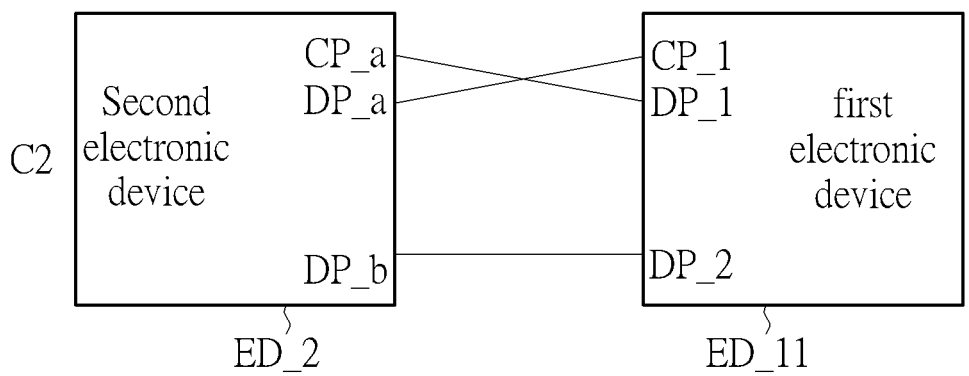
Figure 4:
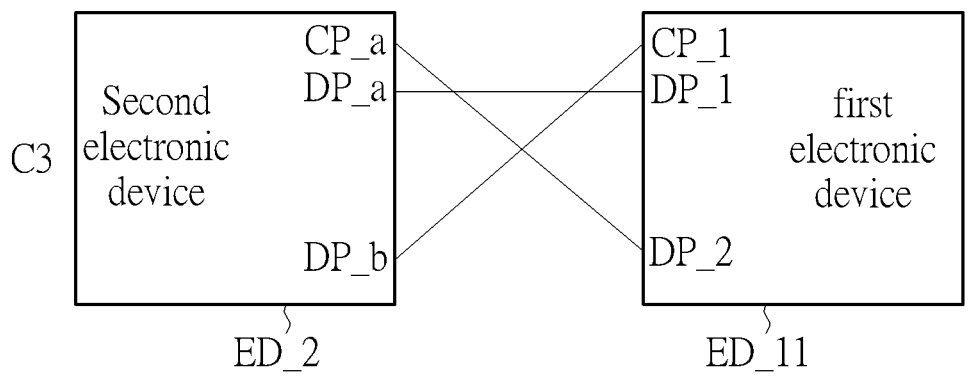
Figure 4:
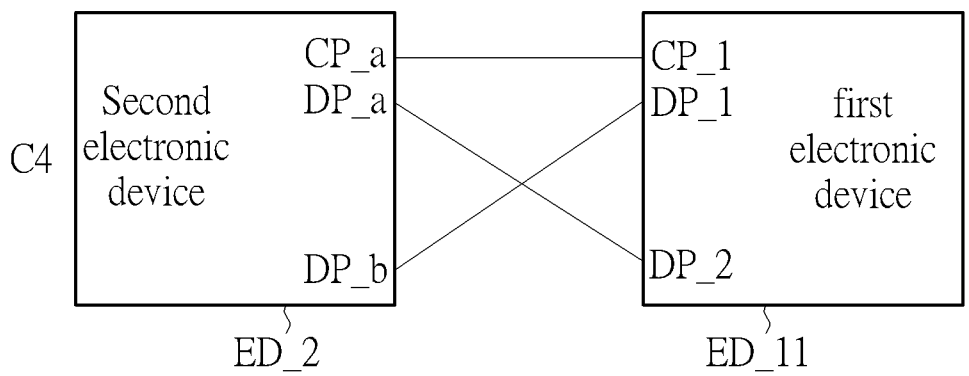
Figure 5:
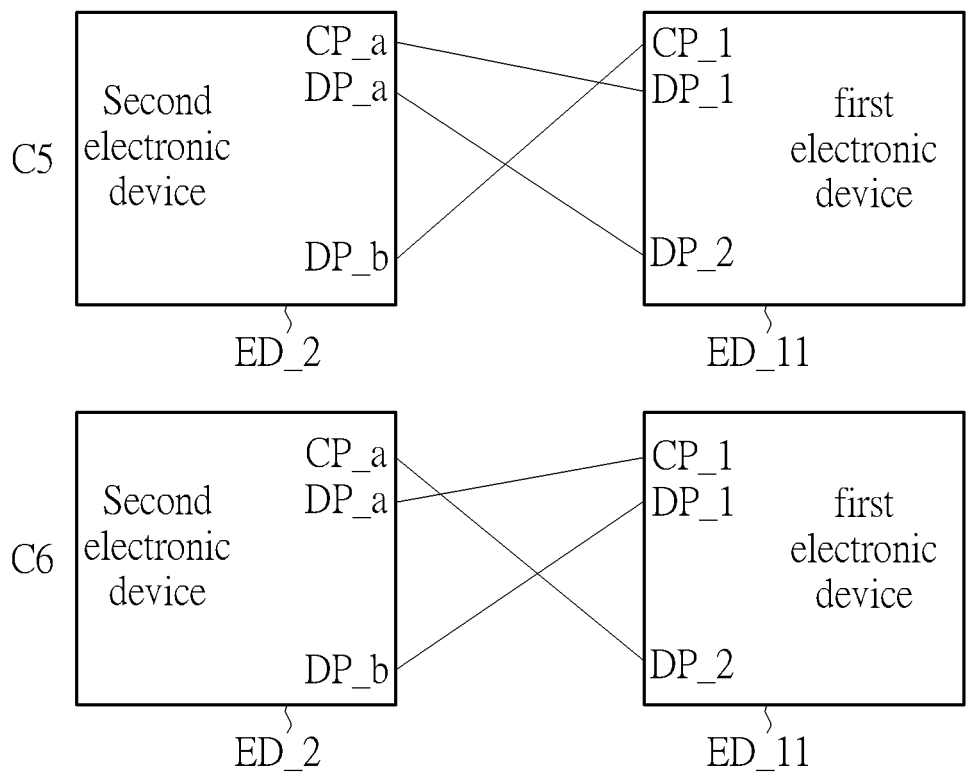

The pins of the first electronic device ED_11, ED_12 are not limited to above-mentioned embodiments. FIG. 3, FIG. 4, FIG. 5 are schematic diagrams illustrating a device ID setting method according to one embodiment of the present invention, which illustrate the examples of connections between the first electronic device and the second electronic device. Please note, in following embodiments, only the first electronic device ED_11 is used for explaining the possible connections rather than the first electronic device ED_11 and the second electronic device ED_12.

As illustrated in FIG. 3-FIG. 5, the first electronic device ED_11 further comprises a clock pin CP_1 besides the data pins DP_1 and DP_2. The data pin DP_1 can be named as a first data pin and the data pin DP_2 can be named as a second data pin. In such case, the data pin DP_1 may be an SDA pin and the data pin DP_2 may be one of a GPIO pin and an INT pin. The INT pin transits after the SDA pin transits and provides one way transmission from the first electronic device ED_11 to the second electronic device ED_2. Also, the data pin DP_a may be an SDA pin and the data pin DP_b may be one of a GPIO pin and an INT pin. In one embodiment, the INT pin can be used for transmitting an interrupt.

In FIG. 3, the connection C1 means the clock pin CP_a is coupled to the clock pin CP_1, the data pin DP_a is coupled to the data pin DP_1, and the data pin DP_b is coupled to the data pin DP_2. The connection C2 means the clock pin CP_a is coupled to the data pin DP_1, the data pin DP_a is coupled to the clock pin CP_1, and the data pin DP_b is coupled to the data pin DP_2. Also, in FIG. 4, the connection C3 means the clock pin CP_a is coupled to the data pin DP_2, the data pin DP_a is coupled to the data pin DP_1, and the data pin DP_b is coupled to the clock pin CP_1. The connection C4 means the clock pin CP_a is coupled to the clock pin CP_1, the data pin DP_a is coupled to the data pin DP_2, and the data pin DP_b is coupled to the data pin DP_1. Additionally, in FIG. 5, the connection C5 means the clock pin CP_a is coupled to the data pin DP_1, the data pin DP_a is coupled to the data pin DP_2, and the data pin DP_b is coupled to the clock pin CP_1. The connection C6 means the clock pin CP_a is coupled to the data pin DP_2, the data pin DP_a is coupled to the clock pin CP_1, and the data pin DP_b is coupled to the data pin DP_1.

Figure 6:
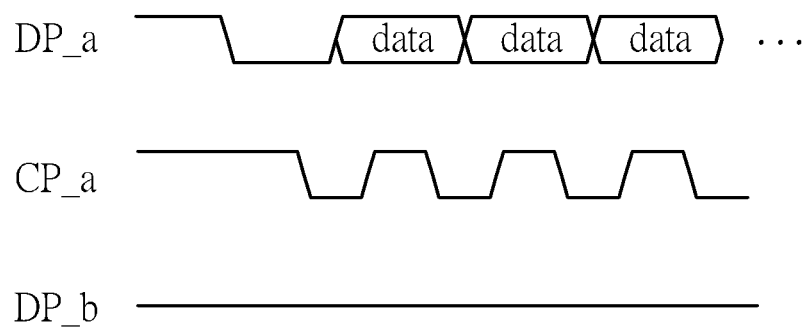
FIG. 6 is a wave chart illustrating signals in the embodiment of FIG. 1, according to one embodiment of the present invention.

FIG. 6 is a wave chart illustrating signals in the embodiment of FIGS. 3, 4, 5, according to one embodiment of the present invention. As illustrated in FIG. 6, after the second electronic device ED_2 sends a start command to the first electronic device ED_11, the data signal from the data pin DP_a is firstly pulled down (transit). After that, the clock signal from the clock pin CP_a is pulled down. Then, the second electronic device ED_2 starts to transmit data to the first electronic device ED_11. After the clock signal at the clock pin CP_a transits or the data is transmitted, the signal at the data pin DP_b transits.

In one embodiment, the first electronic device ED_11 sends responses to the second electronic device ED_2 while signals from the second electronic device ED_2 transit. Therefore, the second electronic device ED_2 can acquire the transition sequence of signals which the second electronic device ED_2 transmits to the first electronic device ED_11 according to the responses. Accordingly, the second electronic device ED_2 can determine which pin does a pin of the first electronic device ED_11 is coupled according to the transition sequence. However, the second electronic device ED_2 can acquire the transition sequence by other methods.

Figure 7:
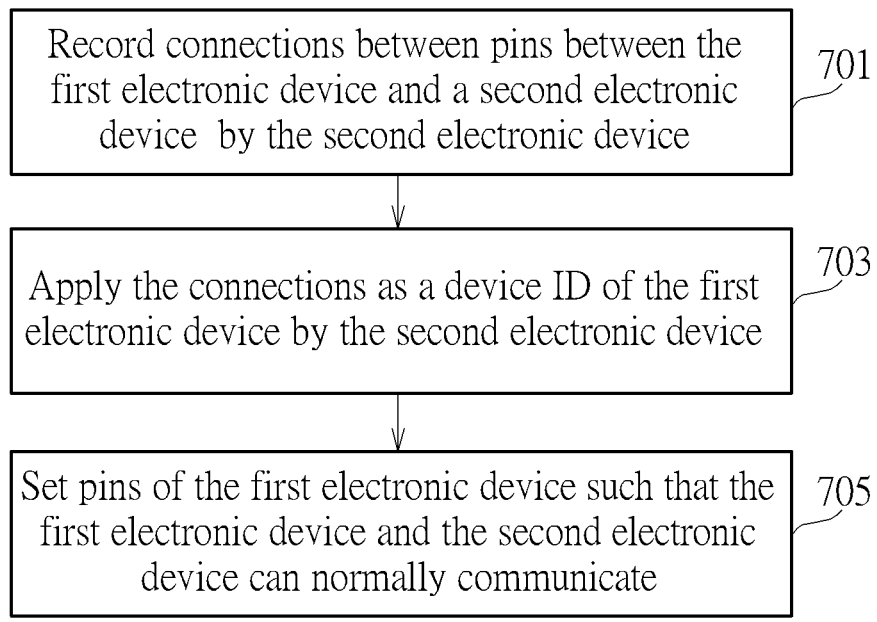
FIG. 7 is a flow chart illustrating a device ID setting method according to one embodiment of the present invention.

FIG. 7 is a flow chart illustrating a device ID setting method according to one embodiment of the present invention. As illustrated in FIG. 7, the device ID setting method comprises:

Step 701

Record connections between pins between the first electronic device (e.g., ED_11, ED_12) and a second electronic device (e.g., ED_2) by the second electronic device. The first electronic device comprises two data pins DP_11, DP_12. Also, the second electronic device comprises a clock pin (e.g., CP_a) and at least one data pin (e.g., DP_a).

Step 703

Apply the connections as a device ID of the first electronic device by the second electronic device. In one embodiment, the second electronic device detects the connections according to a transition sequence of signals which the second electronic device transmits to the first electronic device.

Step 705

Set pins of the first electronic device such that the first electronic device and the second electronic device can normally communicate.

For example, the data pins of the second electronic device are set to be coupled to the data pins of the first electronic device.

Other detail steps can be acquired in view of above-mentioned embodiments, thus are omitted for brevity here.

The device ID setting method can be applied after the first electronic device can normally communicate with the second electronic device. For example, a user can set the pins of the first electronic device after the first electronic device can normally communicate with the second electronic device, to change the device ID of the first electronic device. Also, if the first electronic device is coupled to the second electronic device for the first time, the second electronic device can randomly give the first electronic device a device ID, and the device ID can be changed via the device ID setting method. However, the device ID setting method is not limited to these applications.

Figure 8:
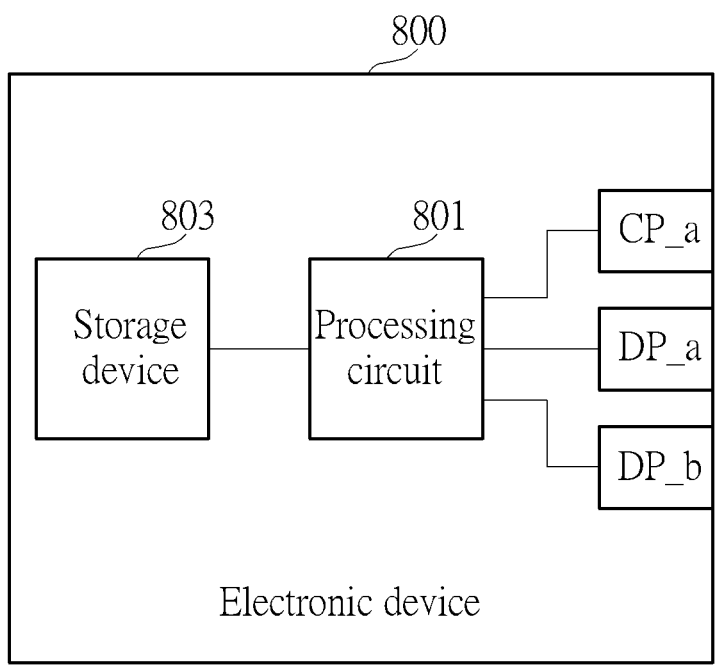
FIG. 8 is a block diagram illustrating an electronic device applying the device ID setting method, according to one embodiment of the present invention.

FIG. 8 is a block diagram illustrating an electronic device applying the device ID setting method, according to one embodiment of the present invention. As illustrated in FIG. 8, the electronic device 800 which can serve as the second electronic device ED_2 in above-embodiments, comprises a processing circuit 801, a storage device 803, a clock pin CP_a, and at least one data pin (in this example, data pins DP_a, DP_b). Please note, the storage device 803 can be provided outside the electronic device 800 rather than inside the electronic device 800. The storage device 803 is configured to store at least one program. The processing circuit 801 is coupled to the clock pin CP_a and the data pins DP_a, DP_b. The above-mentioned device ID setting method is performed when the processing circuit 801 executes the program stored in the storage device 803.

In view of above-mentioned embodiments, the device ID can be set via recording the connection between pins, thus the steps of setting device ID in prior art can be simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
   a clock pin;
   at least one data pin;
   a processing circuit, coupled to the data pin of the electronic device;
   wherein a device ID setting method is performed when the processing circuit executes at least one program, wherein the device ID setting method comprises;
   (a) recording connections between pins of a first electronic device and pins of the electronic device by the electronic device, wherein the first electronic device comprises at least one data pin; and
   (b) applying the connections between the pins of the first electronic device and the pins of the electronic device as a device ID of the first electronic device by the electronic device;
   wherein the electronic device is further connected to another electronic device, and the device ID setting method comprises:
   recording connections between pins of the another electronic device and the pins of the electronic device by the electronic device;
   applying the connections between the pins of the another electronic device and the pins of the electronic device as a device ID of the another electronic device by the electronic device;
   wherein the connections between the pins of the first electronic device and the pins of the electronic device and the connections between the pins of the another electronic device and the pins of the electronic device are different;
   wherein the device ID of the first electronic device and the device ID of the another electronic device are different.

2. The electronic device of claim 1, wherein the step (a) comprises:
   detecting the connections according to a transition sequence of signals which the electronic device transmits to the first electronic device.

3. The electronic device of claim 1, wherein when the step (a) is performed, the clock pin of the electronic device is coupled to one of the data pin of the first electronic device.

4. The electronic device of claim 1, wherein the first electronic device further comprises a clock pin, wherein when the step (a) is performed, one of the data pin of the electronic device is coupled to the clock pin of the first electronic device.

5. The electronic device of claim 1, wherein the first electronic device has a first data pin and a second data pin, wherein the first data pin provides one way transmission from the electronic device to the first electronic device, and the second data pin provides one way transmission from the first electronic device to the electronic device.

6. The electronic device of claim 5, wherein a communication between the electronic device and the first electronic device follows an I2C standard.

7. The electronic device of claim 6, wherein the first data pin is an SDA (Serial Data Line) pin.

8. The electronic device of claim 7, wherein the second data pin is one of a GPIO (General Purpose input/output) pin and an INT pin, wherein a signal at the INT pin transits after the SDA pin transits.

9. A device ID setting method, applied to a first electronic device having at least one data pin, comprising:
   (a) recording connections between pins between the first electronic device and pins of a second electronic device by the second electronic device, wherein the second electronic device comprises a clock pin and at least one data pin; and
   (b) applying the connections between the pins of the first electronic device and the pins of the second electronic device as a device ID of the first electronic device by the second electronic device;
   wherein the second electronic device is further connected to another electronic device, and the device ID setting method comprises:
   recording connections between pins of the another electronic device and the pins of the second electronic device by the second electronic device;
   applying the connections between the pins of the another electronic device and the pins of the second electronic device as a device ID of the another electronic device by the second electronic device;
   wherein the connections between the pins of the first electronic device and the pins of the second electronic device and the connections between the pins of the another electronic device and the pins of the second electronic device are different;
   wherein the device ID of the first electronic device and the device ID of the another electronic device are different.

10. The device ID setting method of claim 9, wherein the step (a) comprises:
   detecting the connections according to a transition sequence of signals which a second electronic device transmits to the first electronic device, by the second electronic device.

11. The device ID setting method of claim 9, wherein when the step (a) is performed, the clock pin of the second electronic device is coupled to one of the data pin of the first electronic device.

12. The device ID setting method of claim 9, wherein the first electronic device further comprises a clock pin, wherein when the step (a) is performed, one of the data pin of the second electronic device is coupled to the clock pin of the first electronic device.

13. The device ID setting method of claim 9, wherein the first electronic device has a first data pin and a second data pin, wherein the first data pin provides one way transmission from the second electronic device to the first electronic device, and the second data pin provides one way transmission from the first electronic device to the second electronic device.

14. The device ID setting method of claim 13, wherein a communication between the second electronic device and the first electronic device follows an I2C standard.

15. The device ID setting method of claim 14, wherein the first data pin is an SDA (Serial Data Line) pin.

16. The device ID setting method of claim 15, wherein the second data pin is one of a GPIO (General Purpose input/output) pin and an INT pin, wherein a signal at the INT pin transits after the SDA pin transits.

* * * * *